(12) United States Patent
Augendre et al.

(10) Patent No.: US 10,665,497 B2
(45) Date of Patent: May 26, 2020

(54) METHOD OF MANUFACTURING A STRUCTURE HAVING ONE OR SEVERAL STRAINED SEMICONDUCTING ZONES THAT MAY FOR TRANSISTOR CHANNEL REGIONS

(71) Applicants: COMMISSARIAT A L'ENERGIE ATOMIQUE ET AUX ENERGIES ALTERNATIVES, Paris (FR); STMICROELECTRONICS Inc, Coppell, TX (US)

(72) Inventors: Emmanuel Augendre, Montbonnot (FR); Nicolas Loubet, Guilderland, NY (US); Sylvain Maitrejean, Grenoble (FR); Pierre Morin, Grenoble (FR)

(73) Assignees: COMMISSARIAT A L'ENERGIE ATOMIQUE ET AUX ENERGIES ALTERNATIVES, Paris (FR); STMICROELECTRONICS Inc, Coppell, TX (US)

( * ) Notice: Subject to any disclaimer, the term of this patent is extended or adjusted under 35 U.S.C. 154(b) by 14 days.

(21) Appl. No.: 15/457,447

(22) Filed: Mar. 13, 2017

(65) Prior Publication Data
US 2017/0263495 A1 Sep. 14, 2017

(30) Foreign Application Priority Data

Mar. 14, 2016 (FR) ..................... 16 52112

(51) Int. Cl.
*H01L 21/20* (2006.01)
*H01L 21/762* (2006.01)
(Continued)

(52) U.S. Cl.
CPC .. *H01L 21/76254* (2013.01); *H01L 21/02381* (2013.01); *H01L 21/02532* (2013.01);
(Continued)

(58) Field of Classification Search
CPC .......... H01L 21/76254; H01L 29/0692; H01L 29/7842; H01L 29/66772; H01L 29/7843; H01L 29/16; H01L 21/02647
(Continued)

(56) References Cited

U.S. PATENT DOCUMENTS 6,503,808 B1 * 1/2003 Matsuno ........... H01L 29/66242
257/E21.371
2007/0181977 A1 * 8/2007 Lochtefeld ...... H01L 21/823807
257/618
(Continued)

FOREIGN PATENT DOCUMENTS

FR 3 014 244 A1 6/2015
WO WO 2006/011107 A1 2/2006
(Continued)

OTHER PUBLICATIONS

B.Desalvo et al., "A mobility enhancement strategy for sub-14nm power-efficient FDSOI technologies," Electron Devices Meeting (IEDM), IEEE International, 2014, Pages 4.
(Continued)

*Primary Examiner* — Mohammad M Hoque
(74) *Attorney, Agent, or Firm* — Oblon, McClelland, Maier & Neustadt, L.L.P.

(57) ABSTRACT

The method of manufacturing a structure comprising one or several strained semiconducting zones capable of forming one or several transistor channel regions, the method including the following steps:
a) providing a substrate coated with a masking layer wherein there are one or several first slits exposing one or several first oblong semiconducting portions made of a first semiconducting material and extending in a first direction,
b) making a second semiconducting material grow with a mesh parameter different from the mesh parameter of
(Continued)

the first semiconducting material, so as to form one or several first semiconducting blocks strained along the first direction, on said one or several first oblong semiconducting portions.

8 Claims, 5 Drawing Sheets

(51) Int. Cl.
| | |
|---|---|
| *H01L 21/02* | (2006.01) |
| *H01L 29/78* | (2006.01) |
| *H01L 29/66* | (2006.01) |
| *H01L 29/786* | (2006.01) |
| *H01L 21/18* | (2006.01) |
| *H01L 29/16* | (2006.01) |
| *H01L 21/8238* | (2006.01) |
| *H01L 29/161* | (2006.01) |

(52) U.S. Cl.
CPC .. *H01L 21/02639* (2013.01); *H01L 21/02647* (2013.01); *H01L 21/187* (2013.01); *H01L 29/16* (2013.01); *H01L 29/66795* (2013.01); *H01L 29/7842* (2013.01); *H01L 29/7843* (2013.01); *H01L 29/7851* (2013.01); *H01L 29/78684* (2013.01); *H01L 21/823807* (2013.01); *H01L 29/161* (2013.01)

(58) Field of Classification Search
USPC ........................................................ 438/479
See application file for complete search history.

(56) References Cited

U.S. PATENT DOCUMENTS

| | | | |
|---|---|---|---|
| 2007/0292987 A1* | 12/2007 | Yoon | ................. C30B 25/18 438/104 |
| 2010/0078680 A1* | 4/2010 | Cheng | ............. H01L 21/02532 257/184 |
| 2011/0049568 A1 | 3/2011 | Lochtefeld et al. | |
| 2015/0155170 A1 | 6/2015 | Reboh et al. | |

FOREIGN PATENT DOCUMENTS

| | | |
|---|---|---|
| WO | WO 2007/014294 A2 | 2/2007 |
| WO | WO 2013/085534 A1 | 6/2013 |

OTHER PUBLICATIONS

French Preliminary Search Report dated Nov. 3, 2016 in French Application 16 52112 filed on Mar. 14, 2016 (with English Translation of Categories of Cited Documents).

Himanshu Kataria et al., "High quality large area ELOG InP on silicon for photonic integration using conventional optical lithography," Proc. of SPIE vol. 8989 898904-1, 10.1117/12.2039794, 2014, pp. 9.

Douglas J Paul, "Si/SiGe heterostructures: from material and physics to devices and circuits." Institute of physics publishing, Semicond. Sci. Technol. 19, 10.1088/0268-1242/19/10/R02, 2004, pp. 35.

U.S. Appl. No. 14/575,329, filed Dec. 18, 2014, 2015/0179474 A1, Sylvain Maitrejean et al.

U.S. Appl. No. 14/579,069, filed Dec. 22, 2014, 2015/0179665 A1, Shay Reboh et al.

U.S. Appl. No. 14/901,027, filed Dec. 28, 2015, 2016/0372362 A1, Thomas Signamarcheix et al.

U.S. Appl. No. 15/049,468, filed Feb. 22, 2016, 2016/0254362 A1, Sylvain Maitrejean et al.

U.S. Appl. No. 15/260,767, filed Sep. 9, 2016, Emmanuel Augendre et al.

U.S. Appl. No. 15/352,198, filed Nov. 15, 2016, Sylvain Barraud et al.

* cited by examiner

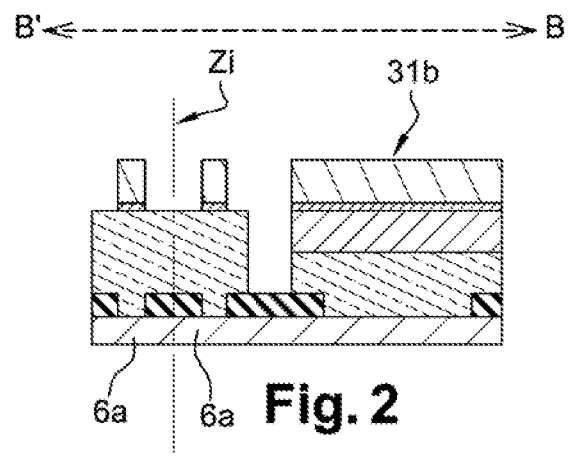
Fig. 2
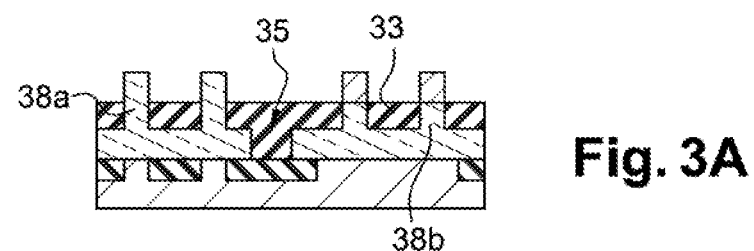
Fig. 3A
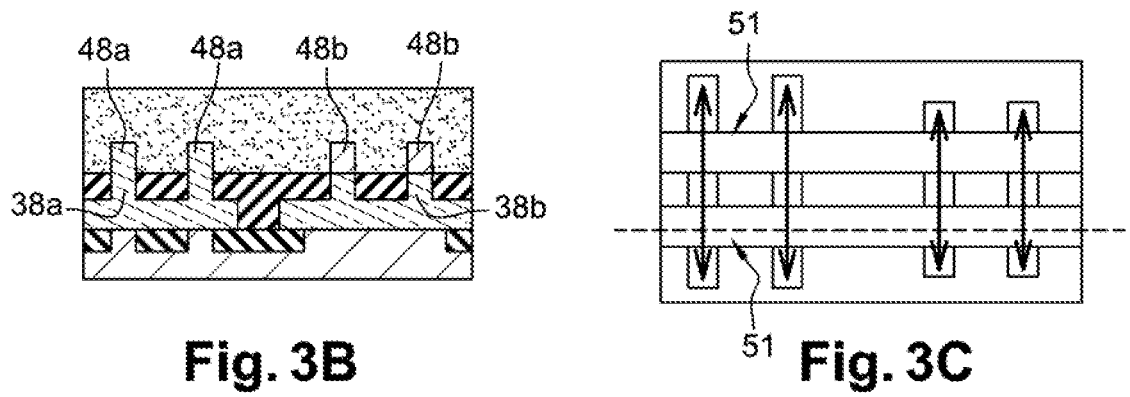
Fig. 3B
Fig. 3C

METHOD OF MANUFACTURING A STRUCTURE HAVING ONE OR SEVERAL STRAINED SEMICONDUCTING ZONES THAT MAY FOR TRANSISTOR CHANNEL REGIONS

TECHNICAL DOMAIN AND PRIOR ART

The present application relates to the field of structures comprising a semiconducting layer with a mechanical strain or stress, and is particularly applicable to the manufacturing of transistors with a strained channel structure.

A mechanical strain refers to a material with crystalline mesh parameter(s) longer than or shorter than a nominal mesh parameter.

In the case in which the deformed mesh parameter is larger than that "natural" parameter of the crystalline material, the material is said to be in tension on tensively strained. When the deformed mesh parameter is smaller than that natural mesh parameter, the material is said to be in compression or compressively strained.

A mechanical strain in tension or in compression on a semiconducting layer can induce an increase in the velocity of charge carriers. The performances of transistor devices formed in such a layer are thus improved.

A frequently encountered example of a strained structure is formed from tensioned silicon obtained by epitaxial growth on a plastically relaxed SiGe buffer layer or based on SiGe in compression made by epitaxy or by a Germanium on Silicon enrichment method.

The above-mentioned techniques generate in-plane biaxial mechanical strains.

The main disadvantage of having a semiconducting layer with biaxial mechanical stress is that when active zones with different widths are made, elastic relaxation takes place at the edges and the average strain, mobility and current density are dependent on the width of these zones.

Furthermore, a compressive stress is particularly beneficial to the transport of holes when it is uniaxial. Similarly, at stresses higher than 1.4 GPa, a tensile stress is particularly beneficial to the transport of electrons when it is uniaxial.

Document: "A mobility enhancement strategy for sub-14 nm power-efficient efficient FDSOI technologies" by DeSalvo et al., discloses the separation of stressed semiconducting zones into narrow bands so as to obtain relaxation in a direction transverse to the direction in which the bands extend.

A problem that arises is to find a new method of making one or several strained semiconducting zones on a substrate, particularly semiconducting zones in uniaxial stress.

PRESENTATION OF THE INVENTION

One embodiment of this invention discloses a method of manufacturing a structure comprising one or several strained semiconducting regions or strained semiconducting blocks capable of forming one or several transistor channel regions, the method including:

providing a substrate coated with a masking layer in which there are one or several first silts exposing one or several first oblong semiconducting portions made of a first semiconducting material and that extend in a first direction, making a second semiconducting material grow with a mesh parameter different from the mesh parameter of the first semiconducting material, so as to form one or several semiconducting blocks strained along the first direction, on said one or several first oblong semiconducting portions.

Due to the oblong shape of the semiconducting portions on which growth takes place, relaxation functions in a direction orthogonal to the first direction.

"Oblong" refers to semiconducting portions that are longer than they are wide.

In order to assure elastic relaxation of the first semiconducting block(s), the first oblong semiconducting portions advantageously have:

a width $W_1$ less than 4 times the critical thickness for plastic relaxation hc of the second semiconducting material, and/or a length $L_1$ equal to at least 20 times the critical thickness for plastic relaxation hc of the second semiconducting material.

According to one possible embodiment of the method, in step b), at least one of said first semiconducting blocks can be formed by growth of a semiconducting band on a first given oblong semiconducting portion extending in the first direction and another semiconducting band on another first oblong semiconducting portion extending in the first direction, said semiconducting bands coming together to form a first semiconducting block, said first semiconducting block being located facing said first given oblong semiconducting portion and said other first oblong semiconducting portion and a masking band belonging to the masking layer and separating said given first oblong semiconducting portion from said other first oblong semiconducting portion.

Such an arrangement increases the relaxation effect in a direction orthogonal to the first direction. A first, semiconducting block tends to be formed with a uniaxial strain in the first direction.

In order to improve elastic relaxation in a direction orthogonal to the first direction, the width of the masking band separating said first given oblong semiconducting portion from said other first oblong semiconducting portion is advantageously less than the critical thickness for plastic relaxation hc of the second semiconducting material.

Advantageously, the second semiconducting material is formed by isotropic epitaxial growth. This minimizes the appearance of crystalline defects.

According to one possible embodiment of the method, there is a step a) in which one or more second slits can be formed in the masking layer exposing one or more corresponding second oblong semiconducting portions based on the first semiconducting material and that extend in a second direction orthogonal to the first direction, step b) including growth of the second semiconducting material on said one or more second oblong semiconducting portions so as to form at least one second semiconducting block strained along the second direction.

The second semiconducting material can be provided relative to the first semiconducting material such that differences in their corresponding mesh parameters create a first semiconducting block and a second semiconducting block strained in compression. The method can then include another step after step b) in which a given semiconducting material is grown on the second semiconducting block, the given semiconducting material having a mesh parameter different from the mesh parameter of the second semiconducting material so as to form a semiconducting block strained in tension on the second semiconducting block. In this case, this make it possible to form a first block strained in compression and a second block covered with a region strained in tension.

The second semiconducting material could for example be based on $Si_{1-x}Ge_x$ (where x>0) when the given semiconducting material is silicon. The first semiconducting material can also be silicon.

The second semiconducting material may be grown on the first semiconducting block.

This can thus raise the first block so that is preferably at the same height as the second semiconducting block.

After said first semiconducting block and said second semiconducting block have been formed, the first semiconducting block and said second semiconducting block may be covered by a first semiconducting region and a second semiconducting region respectively. In this case, the method may further comprise the installation of at least one gate on the first semiconducting region and/or on the second semiconducting region after formation of the first semiconducting region and/or the second semiconducting region.

The method may further comprise the following steps:
forming of an insulating layer on the first semiconducting block and on the second semiconducting block,
bonding of the insulating layer on a support,
removing of said substrate.

According to one possible embodiment wherein the first semiconducting block and the second semiconducting block are covered by a first semiconducting region and a second semiconducting region respectively after formation of the first and the second semiconducting block, the method may also include etching of the first semiconducting block and the second semiconducting block after the substrate has been removed, so as to expose the first semiconducting region and the second semiconducting region respectively.

It is thus possible to form a semiconductor on insulator type structure and in particular to have a semiconducting region strained in tension and a semiconducting region strained in compression on the insulating layer of the support.

Before the first semiconducting region has been formed, an etching stop layer can be formed on said first semiconducting block, said etching stop layer being based on the first semiconducting material. This can facilitate the etching step consisting of exposing the first semiconducting region and the second semiconducting region.

After the first semiconducting region and the second semiconducting region have been exposed, the formation of transistors can be completed and in particular one or more transistor gates can be made on the first semiconducting region and the second semiconducting region.

According to one possible embodiment of the method, a stack is formed on the first semiconducting block, comprising an alternation of rods based on a given semiconducting material and the second semiconducting material, after formation of said one or several first semiconducting blocks.

According to one possible embodiment, the method can include steps for the:
formation of an insulating mask on the first semiconducting block, the insulating mask being provided with one or several holes facing one or several corresponding first oblong semiconducting portions,
formation of semiconducting rods in said one or several holes, by growth of the second semiconducting material or a given semiconducting material with a mesh parameter different from the mesh parameter of the second semiconducting material. Such an embodiment can be used to implement finFET type devices.

BRIEF DESCRIPTION OF THE DRAWINGS

This invention will be better understood after reading the description of example embodiments given purely for information and that are in no way limitative, with reference to the appended drawings on which:

FIG. 2 illustrates an example of a particular arrangement of a transistor gate formed on a strained semiconducting block with a uniaxial strain and resulting from the meeting point of two semiconducting regions;

FIGS. 3A-3C illustrate an example embodiment of fin-FET transistors with a channel strained in uniaxial tension and a channel strained in uniaxial compression respectively;

Figure 1A:
FIGS. 1A-1L illustrate an example embodiment of at least one semiconducting region strained in uniaxial compression and at least one semiconducting region strained in uniaxial tension on the same substrate.

Identical, similar or equivalent parts of the different figures have the same numeric references to facilitate comparison between the different figures.

The different parts shown on the figures are not necessarily all at the same scale, to make the figures more easily understandable.

Furthermore, in the following description, terms such as "upper" that depend on the orientation of the structure should be understood assuming that the structure is oriented as shown in the figures.

DETAILED PRESENTATION OF PARTICULAR EMBODIMENTS

One example method of making a semiconducting block strained in uniaxial compression and a semiconducting block strained in uniaxial tension on the same support will now be presented with reference to FIGS. 1A-1L.

The start material for this method may be a surface layer 1 of a bulk substrate or a semiconductor on insulator type substrate. The surface layer is a semiconducting material, for example silicon, and particularly monocrystalline silicon.

The first step is to form a layer 3 on substrate 1 made of a material that will form masking for epitaxial growth. This layer 3 may be made from an amorphous and typically insulating material for example such as silicon nitride or advantageously silicon oxide. It the layer 3 is an oxide, it will for example be made by growth or by deposition.

The next step is to form long and narrow openings in the masking layer 3, called "slits" 4a, 4b, for example by photolithography and then etching of the masking layer 3.

The slits 4a, 4b include one or several first slits 4a that extend in a first direction parallel to the principal plane of the substrate 1, and one or several second slits 4b that extend in a second direction, parallel to the principal plane of the substrate 1 and orthogonal to the first direction.

Figure 1B:
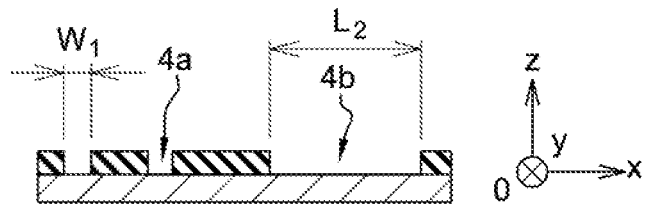

In this context and in the remainder of this description, "principal plane" of the substrate 1 means a plane passing through the substrate 1 that is parallel to the [O; x; y] plane of the orthogonal coordinate system [O; x; y; z] given on FIG. 1B.

In the example in FIG. 1B, the first and second directions are parallel to the y axis and the z axis respectively of the orthogonal coordinate system [O; x; y; z]. The slits 4a, 4b are longer than they are wide and typically they are rectangular in shape with a length very much greater than their width, for example at least 10 times greater than their width.

A first semiconducting material is then made to grow on one or several semiconducting regions of the substrate exposed by the first slit(s) 4a and on one or several regions of the substrate exposed by the second slit(s) 4b, respectively. The first slits 4a may be made facing a region dedicated to manufacturing of at least one transistor of a first type, for example type P, while the second slits 4b in this case are made facing another region dedicated to manufacturing a different type of transistor, for example type N.

Figure 1C:
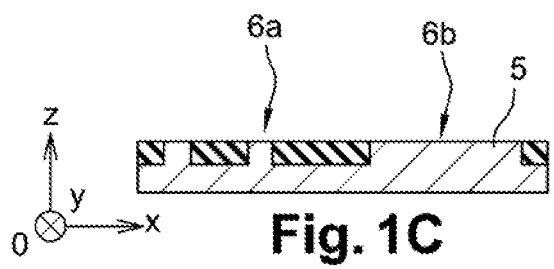
Figure 1D:
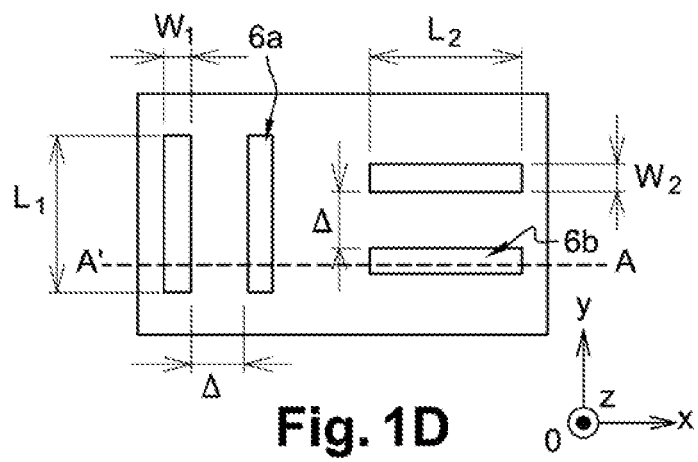
Figure 1E:
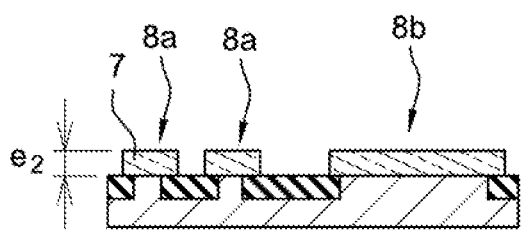
Figure 1F:
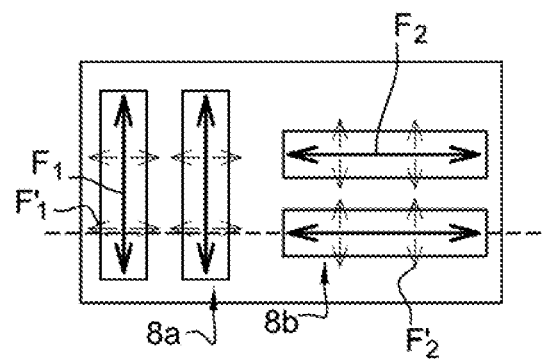

Thus, a first oblong semiconducting portion 6a and a second oblong semiconducting portion 6b based on the first semiconducting material 5 are then formed in a first slit 4a and in a second slit 4b respectively (FIG. 1C gives a cross-sectional view A'A and FIG. 1D gives a top view of the structure). The first semiconducting material 5 may be similar to the material of the substrate on which it is formed, for example silicon. Growth of the oblong portions 6a and 6b can be controlled such that these oblong portions 6a, 6b reproduce the shape of the silts 4a, 4b. The oblong semiconducting portions 6a and 6b are preferably arranged such that their top face is approximately at the same level as the top face of the masking layer 3. "Approximately at the same level" means that the oblong semiconducting portions 6a and 6b are at the same level or project from the upper face of the masking layer 3, preferably by not more than 5 nm.

A second semiconducting layer 7 with a mesh parameter different from that of the first semiconducting material 5 is then grown on the oblong semiconducting portions 6a, 6b exposed by masking. The second semiconducting material may for example be silicon germanium ($Si_{1-x}Ge_x$), particularly when the first semiconducting material is silicon. There is a mismatch between the second semiconducting material 7, also called the "buffer" material and that is formed by epitaxial growth, and the first semiconducting material 5.

In the case of a growth of SiGe, growth preferably fakes place at a temperature below 600° C. and under an inert atmosphere, for example $N_2$.

Preferably, the dimensions of slits 4a, 4b and consequently the dimensions of the oblong semiconducting portions 6a, 6b are determined as a function of the nature of the second semiconducting material 7 and the critical thickness for plastic relaxation hc associated with this material. The critical thickness hc is defined as the thickness below which the material grows without dislocation and that is referred to in the document entitled: "Critical thickness for plastic relaxation of SiGe" by Hartmann et at Journal of Applied Physics 2011.

Document "Si/SiGe heterostructures: from material and physics to devices and circuits", by D. J. Paul, Semiconductor Science and Technology, for example can be used to obtain an estimated critical thickness as a function of the concentration x of germanium in the second semiconducting material 7 when the second semiconducting material is silicon germanium ($Si_{1-x}Ge_x$). In this case, the critical thickness is estimated in the "metastable" part of the graph in FIG. 4.

The thickness $e_2$ of the second semiconducting material 7 that is made to grow is preferably chosen to be less than the critical relaxation thickness hc and preferably such that $e_2 \leq hc/2$.

The epitaxy conditions of the second semiconducting material 7 are advantageously chosen such that isotropic growth is made so as to limit the creation of crystalline defects and to obtain an approximately plane upper face. In particular, growth at low temperature is made, for example at less than 600° for SiGe to minimize differences in growth rates along different crystalline directions. This growth can also be made in the gas phase using a neutral gas such as $N_2$ as the vector gas (also called propulsion gas) to encourage isotropic growth, and to avoid adsorption of hydrogen.

Due to the configuration of the oblong semiconducting portions 6a, 6b, the second semiconducting layer 7 tends to adopt the mesh parameter of the first semiconducting material 5 in the plane and particularly in the longitudinal direction of the oblong semiconducting portions 6a, 6b respectively, in other words in the longitudinal direction of slits 4a, 4b respectively. Thus, on a first oblong semiconducting portion 6a base on the first semiconducting material 5, a first semiconducting band 8a is formed based on the second semiconducting material 7 that follows the mesh parameter of the first semiconducting material 5 in said first direction (direction parallel to the y axis on FIG. 1F), while on a second oblong semiconducting portion 6b, a second semiconducting band 8b is formed based on the second semiconducting material 7 that follows the mesh parameter of the first semiconducting material 5 in said second direction (direction parallel to the y axis on FIG. 1F). Due to the arrangement of the oblong semiconducting zone 6a, 6b, in the case in which the second semiconducting material 7 is silicon germanium, the semiconducting bands 8a are strained in compression (symbolized by arrows F1 on FIG. 1F) in the first direction and relaxed in the second direction (arrows F'1), while the semiconducting strips 8b are in strained in compression (arrows F2) in the second direction and relaxed in the first direction (arrows F'2).

In order to minimize plastic relaxation and so as to obtain effective elastic relaxation and maintain a uniaxial stress in an orthogonal direction (the uniaxial stress being in a first direction for bands 8a and in the second direction for bands 8b), slits 4a, 4b are advantageously provided with widths $W_1$ (measured parallel to the x axis for the first slit 4a) and $W_2$ (measured parallel to the y axis for the second slit 4a) such that $W_1 \leq 4 \times hc$ and $W_2 \leq 4 \times hc$ and with lengths $L_1$ (measured parallel to the y axis for a first slit 4a) and $L_2$ measured parallel to the x axis for a second sift 4a) such that $L_1 \geq 20 \times hc$ and $L_2 \geq 20 \times hc$ respectively, where hc is the critical thickness for plastic relaxation mentioned above. Similarly a space Δ can be formed between the slits 4a (or 4b) parallel to each other such that $2 \times hc \geq \Delta$ so as to obtain the junction of regions of material 7 located on nearby slits (for example 4a and 4b) before their plastic relaxation. The fact that such a spacing Δ between the slits is chosen is aimed at assuring that regions 18a and 18b are formed before the material starts to relax plastically. A junction of zones obtained from slits 4a and 4B is thus made before relaxation Growth of the second semiconducting material 7 may be organized such that several parallel semiconducting bands 8a made from parallel and juxtaposed oblong semiconducting portions 6a join together to form a first semiconducting block 18a as illustrated on FIGS. 1G and 1H. Similarly, semi-conducting bands 8b obtained from oblong semiconducting portions 6b located side by side and that extend in the second direction, might come together to form a second semiconducting block 18b.

Figure 1G:
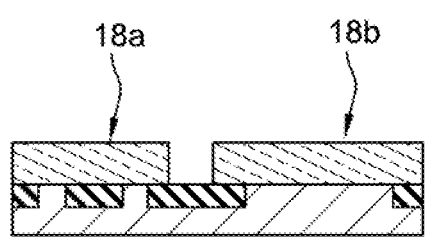
Figure 1H:
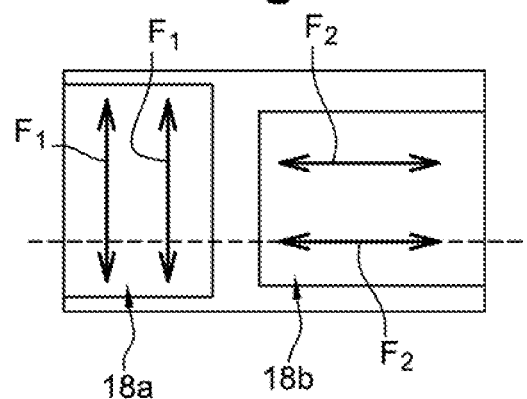
Figure 1I:
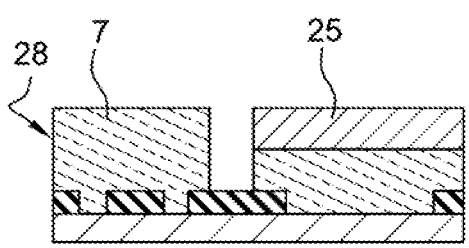

In the example shown in FIGS. 1G and 1H, the semiconducting blocks 18a, 18b extend facing parallel oblong semiconducting portions and at least one masking layer band 3 separating two parallel oblong semiconducting portions.

The semiconducting blocks 18a, 18b thus formed have a compressive uniaxial strain along the first direction (arrows F1) and a compressive uniaxial strain along the second direction (arrows F2). The first semiconducting block 18a may be dedicated to manufacturing of at least one PMOS type transistor, while the second semiconducting block 18b, discontiguous from the first block 18a, will form a channel region of at least one NMOS type transistor.

Figure 1J:
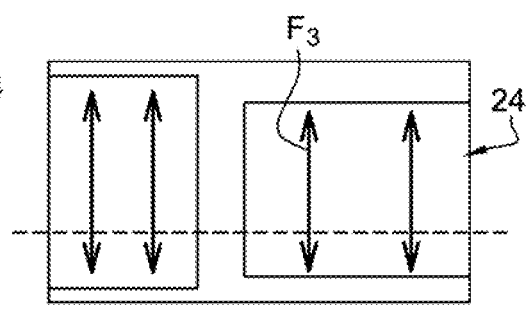
Figure 1K:
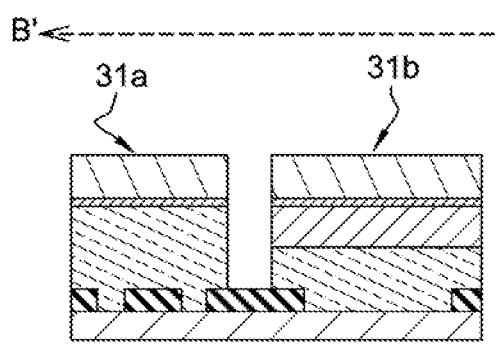
Figure 1L:
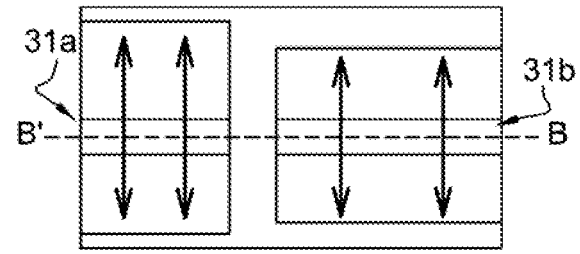

The next step is epitaxial growth of a region 24 of given semiconducting material 25 on the second semiconducting block 18b with a mesh parameter different from the mesh parameter of the second semiconducting material 7 (FIGS. 1l and 1J). The difference in mesh parameters of the semiconducting materials 7 and 25 is such that the given semiconducting material 25 that is grown on the second semiconducting block 18b in uniaxial compressive strain is then strained in uniaxial tension (symbolized by arrows F3 on FIG. 1l), parallel to the first direction. The given semiconducting material 25 is for example made of silicon when the second semiconducting material 7 is made of silicon germanium. Relaxation of the region 24 is minimized by making its thickness less than a limiting thickness. In the case of a silicon layer 25 on a second semiconducting block 18b made of 20% SiGe, this limiting thickness may for example be of the order of 12 nm.

Growth of the given semiconducting material 25 on the first semiconducting block 18a can be prevented by covering the first semiconducting block with a masking zone, for example based on silicon oxide or silicon nitride. The mask that protected the first block 18a is then removed after epitaxy.

An additional layer 28 of the second semiconducting material 7 can be form by epitaxial growth so as to raise the first block 18a relative to the second block 18b, and preferably to make blocks 18a, 18b with similar heights. Growth of the second semiconducting material 7 on the second semiconducting block 18b can then be prevented by covering the second semiconducting block with a masking zone, for example based on silicon oxide or silicon nitride. The mask that protected the second block 18b is then removed after epitaxy.

The result obtained is thus a first block 18a coated with a surface region 27 strained In uniaxial compression and a second block 18b coated with a surface region 24 strained in uniaxial tension. The tensively strained region 24 is capable of containing at least one NMOS transistor channel region while the compressively strained region 28 is conducive to the manufacture of at least on a PMOS transistor channel region.

The order in which the regions 24 and 28 are made can possibly be inverted from the order described above.

The formation of transistors can then be completed, particularly by forming one or several gates 31a, 31b on the first block 18a and on the second block 18b respectively. The gates 31a, 31b are preferably arranged so as to extend in a direction orthogonal to the direction of uniaxial stresses of regions 24, 28 respectively (FIG. 1K and FIG. 1L).

The manufacture of transistors can also be completed by steps for the formation of insulating spacers on each side of the gates, source and drain regions, and the formation of contacts (steps not represented).

Advantageously, the gate(s) is (are) located in a zone at a distance from the zone in which the semiconducting bands 8a come into contact to form the first block 18a. Similarly, the gate(s) of one or several type N transistors are located at a distance from the zone in which the semiconducting bands 8b come into contact to form the first block 18b, the contact zones being zones in which crystalline defects, if any, might be created. In the example illustrated on FIG. 2, gates 31a are formed facing oblong semiconducting portions 6a that were used as a growth support, in other words facing slits 4a, while a contact zone of the recrystallization fronts is shown diagrammatically by means of a dashed line Zi.

According to a variant of the method illustrated on FIGS. 3A-3C, different types of finFET transistors can be made with strained channel regions with different natures of strains on the same support.

To achieve this, we can for example start from a structure like that described with reference to FIGS. 1G and 1H comprising a first semiconducting block 18a, and a second semiconducting block 18b discontiguous from the first semiconducting block 18a.

An insulating mask 33 is then made, for example based on silicon oxide covering the semiconducting blocks 18a and 18b. The insulating mask 33 can be arranged so as to extend in a space 35 separating the semiconducting blocks 18a, 18b.

Holes are provided in the insulating mask 33, and expose portions of the first semiconducting block 18a and the second semiconducting block 18b on which semiconducting rods 38a, 38b respectively are grown, for example the rods being parallelepiped shaped and based on the second semiconducting material 7, for example silicon germanium. The holes and exposed portions of the semiconducting blocks 18a, 18b can then be located particularly facing slits 4a, 4b.

The rod or rods 38b located on the second block 18b can then be extended by semiconducting regions 48b, in a zone located above the top face of the insulating mask 33. These regions 48b are formed by epitaxial growth of a given semiconducting material 25, typically silicon, with a mesh parameter different from the mesh parameter of the second semiconducting material 7, and in particular adapted so that when it grows on the second semiconducting material 7 strained in uniaxial compression, this material 25 is then strained in uniaxial tension. The regions 48b made on the second block 18b may also be in the form of parallelepiped shaped rods.

In the case in which the regions 48b are all in the form of parallelepiped shaped Si rods made on SiGe rods 38b acting as channel for FinFET type devices, the thickness of the regions 48b is preferably less than 50 nm. During the growth of regions 48b by epitaxy, the first block 18a can be protected by a mask so as to prevent growth of the given semiconducting material 25 facing the first semiconducting block 18a. This mask can subsequently be removed.

As illustrated on FIG. 3A, the rod or rods 38a located on the first block 18a can also be extended by regions 48a formed by growth of the second semiconducting material 7. The second block 18b can be protected by a temporary mask during epitaxial growth of the regions 48a.

The semiconducting regions 48a are designed to form channel regions of at least one P type transistor, while the semiconducting regions 48b are capable of forming channel regions of at least one N type transistor. The next step is to make one or several gate-all-around blocks 51 on regions 48a, 48b (FIG. 3B). This is done by performing steps to deposit the gate dielectric and then the gate material, and then etching these materials.

In the example arrangement in FIG. 3C, the gate blocks 51 are common to the semiconducting zones 48a strained in compression and the semiconducting regions 48b strained in tension, the gate blocks 51 extending orthogonally to these regions.

According to one possible embodiment, it may be required to transfer the semiconducting region or regions in uniaxial strain that have been formed (for example using a method like that described above with reference to FIGS. 1l-1J) onto another substrate.

This transfer may be done particularly when it is required to have this or these semiconducting regions on a semiconductor on insulator type structure, and particularly when it is required to have the strained semiconductor region(s) on a thin insulating zone, for example in order to make a device using an FDSOI ("Fully Depleted Silicon insulator") and/or UTBB ("Ultra-Thin Body and Box") technology.

An example embodiment of this type of transfer is shown in FIGS. 4A-4D.

For example, starting from a structure like that described with reference to FIGS. 1G and 1H comprising a first semiconducting block 18a and a second semiconducting block 18b discontiguous from the first semiconducting block 18a, we can form semiconducting regions 28, 24 on the first block 18a and on the second block 18b respectively and that are strained in uniaxial tension and in uniaxial compression respectively.

We can facilitate removal of the donor structure by coating the first semiconducting block 18a with an etching stop layer 61. The etching stop layer 61 is based on the same material as the semiconducting region 24, and particularly silicon.

Figure 4A:
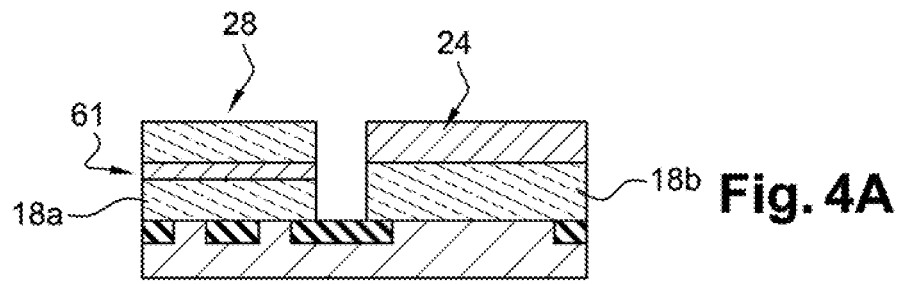
FIGS. 4A-4D illustrate an example of the method in which, after a semiconducting region strained in uniaxial compression and a semiconducting region strained in uniaxial tension have been formed on the same substrate, these regions are transferred onto another support so as to make a strained semiconductor on insulator type structure.
Figure 4B:
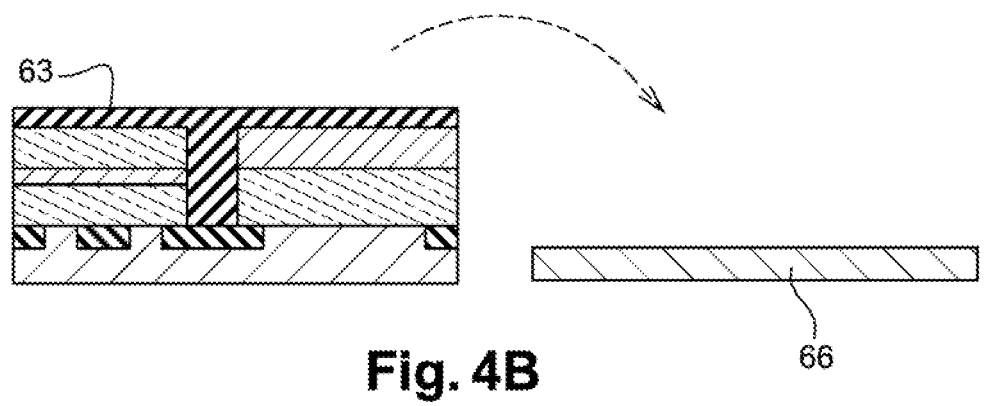

This stop layer 61 is intermediate between the first block 18a and the semiconducting region 28 made of a semiconducting material strained in compression in which at least one transistor channel region is provided (FIG. 4B). The etching stop layer 61 is preferably thin, for example less than 5 nm thick.

An insulating layer 63 is then formed, for example based on silicon oxide covering the semiconducting zones 28, 24. In the example embodiment in FIG. 4B, the insulating layer 63 extends between the semiconducting regions 24, 28 and forms an insulating separation between these regions 24, 28.

Figure 4C:
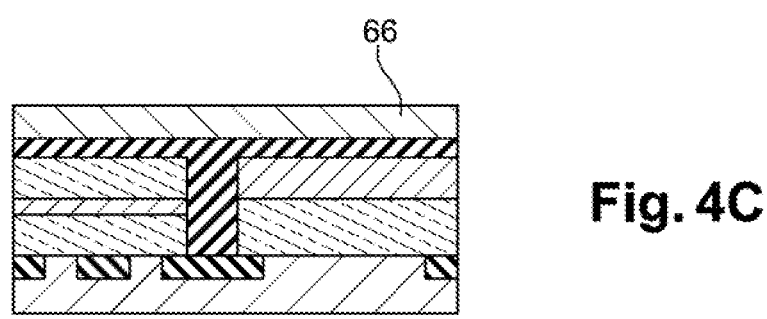

The insulating layer 63 can be used as a bonding layer for direct bonding to another substrate 66 (FIG. 4C). The other substrate 66 is semiconducting and may for example be based on silicon and possible coated with an oxide layer. A "Chemical Mechanical Polishing/Planarisation" (CMP) step may be applied on the insulating layer 63 to facilitate bonding.

The initial substrate 1 can then be removed for example by "grinding" and then chemical etching for example using TMAH, particularly when the substrate 1 is of the bulk type and is made of silicon.

An etching stop layer may be formed in the substrate 1 by doping, for example using boron. The oxide or nitride based masking layer 3 can also be removed, followed by the blocks 18a, 18b based on the second semiconducting material 7. When these blocks 18a, 18b are based on silicon germanium, an etching for example using an HF:H$_2$O$_2$:CH$_3$COOH mix can be used. Etching is stopped when the etching stop layer 61 and the semiconductor region 24 typically made of silicon is reached.

Figure 4D:
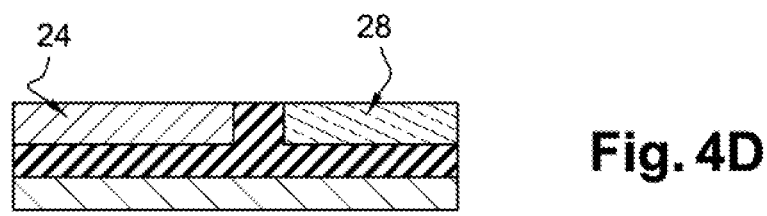

The result obtained is then a structure like that illustrated on FIG. 4D provided with a semiconducting zone 28 strained in compression and a semiconducting zone 24 strained in tension supported on the insulating layer 63 of the substrate 66.

One or several transistors can be made starting from such a structure, particularly when at least one NFET type transistor is formed on the semiconducting region 24 and at least one PFET type structure is formed on the semiconducting region 28.

Figure 5A:
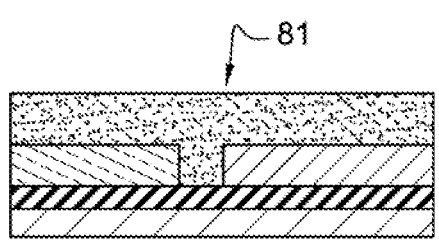
FIGS. 5A-5B illustrate an embodiment of transistors on a semiconducting region strained in uniaxial compression and a semiconducting region strained in uniaxial tension, respectively.
Figure 5B:
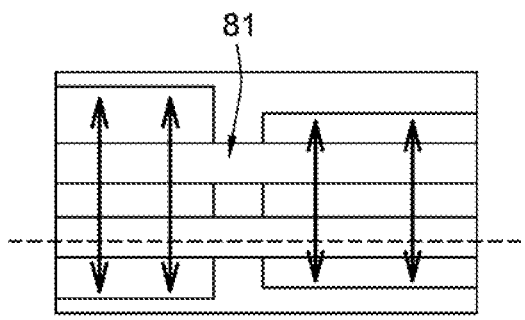

FIGS. 5A-5B illustrate an embodiment of electrodes 81 of gates on semiconducting regions 24, 28 in which transistor channel regions are provided.

We previously described an example embodiment of strained semiconducting regions for NFET and PFET transistors, particularly using the FDSOI type technology, or of the finFET type.

A method according to the invention can be adapted to the use of transistors with a different arrangement or different architectures. For example, transistors with nano-wires or with stacks of semiconducting rods can be manufactured.

Figure 6A:
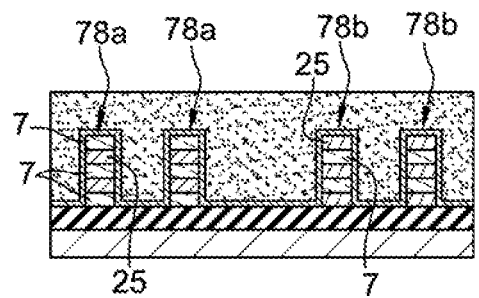
FIGS. 6A-6B illustrate an embodiment of transistors with a channel structure formed from superposed strained semiconducting rods.
Figure 6B:
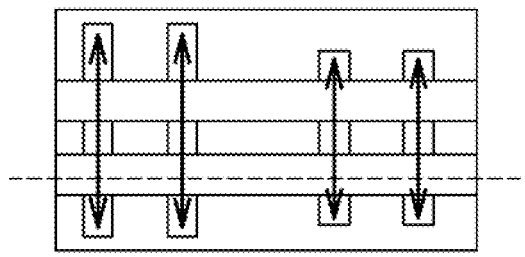

In the example illustrated on FIGS. 6A-6B, one or several first semiconducting structures 78a are made formed from a stack comprising an alternation of rods or layers based on the second semiconducting material 7, and particularly silicon germanium (Si$_{1-x}$Ge$_x$), and layers of the given semiconducting material 25, and particularly silicon, with a mesh parameter different, from the mesh parameter of the second semiconducting material 7. One or two first semiconducting structures are then made on the same support as the first structures 78a, comprising a stack of rods or layers with an alternation of layers based on the second semiconducting material and layers of the given semiconducting material 25.

A first structure 78a with stacked alternating semiconducting layers or rods can be formed from a device like that illustrated in FIGS. 1C-1D, particularly making a series of epitaxial growths from an oblong semiconducting zone 6a. The second structure 78b with stacked alternating semiconducting layers or rods can also be formed from an oblong semiconducting zone 6b.

In the same way as for making the semiconducting regions 24, 28 described above, the order in which the structures 78a, 78b are made can be reversed.

Each of the example embodiments has been given principally using silicon germanium (Si$_{1-x}$Ge$_x$) as the second semiconducting material 7, and with silicon as the given semiconducting material 25.

A method implemented according to the invention can use other pairs of semiconducting materials with a preferably small mesh mismatch, typically less than 3%.

For example, it would be possible to form a first strained semiconducting region or semiconducting structure made of Si$_x$C$_{1-x}$, on the same support as a second strained semiconducting region or structure made of Si. According to another example, the first semiconducting region or structure is made of Ge and is on the same support as a second region made of Ge$_x$Sn$_{1-x}$.

According to another example of pairs of materials, it would be possible for example to use a substrate 1 base on InP with the second semiconducting material 7 being In$_x$Ga$_{1-x}$As where 0.13<x<0.53 that is grown on the InP.

The invention claimed is:

1. A method of fabricating a transistor device comprising a transistor with uniaxial compressive strain and a transistor with uniaxial tensile strain, the method including:
   a) providing a substrate coated with a masking layer wherein there is (are) one or several first slit(s) exposing one or several first oblong semiconducting portion(s) made of a first semiconducting material and extending in a first direction,
   the masking layer further being provided with one or several second slit(s) exposing one or several second oblong semiconducting portion(s) respectively, based on the first semiconducting material and extending in a second direction, orthogonal to the first direction,
wherein said one or several first slit(s) and said one or several second slit(s) are arranged in said masking layer, and
wherein
said one or several first oblong semiconducting portion(s) has (have) a first length measured in a first direction and a first width smaller than said first length and that is measured in a second direction,
said one or several second oblong semiconducting portion(s) has (have) a second length measured in said second direction and a second width smaller than said second length and that is measured in said first direction,
the one or several first oblong semiconducting portion(s) being orthogonal to the one or several second oblong semiconducting portion(s);
b) making a second semiconducting material growing with a mesh parameter different from the mesh parameter of the first semiconducting material, so as to form:
at least one first semiconducting block strained along the first direction on said one or several first oblong semiconducting portion(s),
at least one second semiconducting block strained along the second direction on said one or several second oblong semiconducting portion(s),
wherein the mesh parameter of the second semiconducting material relative to the mesh parameter of the first semiconducting material is such that said at least one first semiconducting block and said at least one second semiconducting block are compressively strained with compressive uni-axial strain,
the method further including after forming said at least one first semiconducting block and said at least one second semiconducting block:
growing on said at least one second semiconducting block, a given semiconducting material having a mesh parameter different from the mesh parameter of said second semiconducting material so as to form a semiconducting region having a uniaxial tensile strain on the at least one second semiconducting block, said uniaxial tensile strain being along a direction parallel to the first direction, then
forming a first gate electrode on a first region of said at least one first semiconducting block with uniaxial compressive strain and a second gate electrode on said semiconducting region having tensile uniaxial strain of said at least one second semiconducting block.

2. The method according to claim 1, wherein in step b),
at least one of said one or several first semiconducting block(s) is formed by growth of a semiconducting band on a first given oblong semiconducting portion extending in the first direction and another semiconducting band on another first oblong semiconducting portion extending in the first direction,
said semiconducting bands coming together to form a first semiconducting block, the first semiconducting block being located facing said first given oblong semiconducting portion, and
said another first oblong semiconducting portion and a masking band belonging to the masking layer and separating said given first oblong semiconducting portion from said other first oblong semiconducting portion.

3. The method according to claim 2, in which the width of said masking band separating said first given oblong semiconducting portion from said another first oblong semiconducting portion is less than the critical thickness for plastic relaxation hc of the second semiconducting material.

4. The method according to claim 3, wherein the second semiconducting material is formed by isotropic epitaxial growth.

5. The method according to claim 1, wherein the second semiconducting material is based on $Si_{1-x}Ge_x$ (where x>0) and the given semiconducting material is silicon.

6. The method according to claim 1, wherein the method further comprises a step after step b): the second semiconducting material is grown on the one or several first semiconducting block(s).

7. The method according to claim 1, wherein the method further includes the following steps:
forming an insulating mask on the one or several first semiconducting block(s), the insulating mask comprising one or several holes facing one or several corresponding first oblong semiconducting portion(s),
forming semiconducting rods in said one or several holes, by growth of the second semiconducting material or a given semiconducting material with a mesh parameter different from the mesh parameter of the second semiconducting material.

8. The method according to claim 1, wherein
said first semiconducting block is formed on said on several first oblong semiconducting portions, and
said second semiconducting block is formed on several second oblong semiconducting portion(s).

* * * * *